United States Patent
Morikita et al.

(10) Patent No.: US 10,692,726 B2
(45) Date of Patent: Jun. 23, 2020

(54) METHOD FOR PROCESSING WORKPIECE

(71) Applicant: TOKYO ELECTRON LIMITED, Tokyo (JP)

(72) Inventors: Shinya Morikita, Miyagi (JP); Takanori Banse, Miyagi (JP); Yuta Seya, Miyagi (JP); Ryosuke Niitsuma, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/315,812

(22) PCT Filed: Jul. 4, 2017

(86) PCT No.: PCT/JP2017/024508
§ 371 (c)(1),
(2) Date: Jan. 7, 2019

(87) PCT Pub. No.: WO2018/008640
PCT Pub. Date: Jan. 11, 2018

(65) Prior Publication Data
US 2019/0252198 A1 Aug. 15, 2019

(30) Foreign Application Priority Data
Jul. 8, 2016 (JP) .................... 2016-136177

(51) Int. Cl.
*H01L 21/3065* (2006.01)
*H05H 1/46* (2006.01)
(Continued)

(52) U.S. Cl.
CPC .... *H01L 21/3065* (2013.01); *H01J 37/32082* (2013.01); *H01J 37/32165* (2013.01);
(Continued)

(58) Field of Classification Search
CPC ........... H01L 21/0276; H01L 21/31144; H01L 21/02164; H01L 21/02274; H01L 21/67069; H01J 37/32082; H01J 37/32165
(Continued)

(56) References Cited

U.S. PATENT DOCUMENTS

2008/0047932 A1* 2/2008 Terasaki .................. C03C 17/42
216/41
2015/0076705 A1* 3/2015 Singh .................... H01L 23/481
257/774
(Continued)

FOREIGN PATENT DOCUMENTS

JP S62-291940 A 12/1987
JP 2004-080033 A 3/2004
(Continued)

OTHER PUBLICATIONS

International Search Report issued in PCT/JP2017/024508; dated Aug. 1, 2017.

*Primary Examiner* — Binh X Tran
(74) *Attorney, Agent, or Firm* — Studebaker & Brackett PC

(57) ABSTRACT

A method MT according to an embodiment provides a technique capable of controlling a pattern shape during processing of an organic film and the like. A wafer W as an object to which the method MT in the embodiment is applied includes an etching target layer EL, an organic film OL, and a mask ALM, the organic film OL is constituted by a first region VL1 and a second region VL2, the mask ALM is provided on the first region VL1, the first region VL1 is provided on the second region VL2, and the second region VL2 is provided on the etching target layer EL. In the method MT, the first region VL1 is etched to reach the second region VL2 by generating a plasma of a gas con- (Continued)

taining nitrogen gas in the processing container 12 in which the wafer W is accommodated, a mask OLM1 is formed from the first region VL1, a protective film SX is conformally formed on a side surface SF of the mask OLM1, the second region VL2 is etched to reach the etching target layer EL to form a mask OLM2 from the second region VL2.

17 Claims, 4 Drawing Sheets

(51) Int. Cl.
    *H01J 37/32*     (2006.01)
    *H01L 21/308*     (2006.01)
    *H01L 21/311*     (2006.01)

(52) U.S. Cl.
    CPC ...... *H01L 21/308* (2013.01); *H01L 21/31116* (2013.01); *H01L 21/31144* (2013.01); *H05H 1/46* (2013.01)

(58) Field of Classification Search
    USPC .......................... 438/699, 702, 703, 717, 736
    See application file for complete search history.

(56) References Cited

U.S. PATENT DOCUMENTS

| 2015/0160557 A1* | 6/2015 | deVilliers ............. G03F 7/2024 430/323 |
| 2016/0163557 A1* | 6/2016 | Hudson ............. H01L 21/30655 438/696 |
| 2018/0047578 A1* | 2/2018 | Morikita ............. H01L 21/0276 |

FOREIGN PATENT DOCUMENTS

| JP | 2008-078617 A | 4/2008 |
| JP | 2009-016815 A | 1/2009 |

* cited by examiner

METHOD FOR PROCESSING WORKPIECE

TECHNICAL FIELD

An embodiment of the present invention relates to a method for processing a workpiece.

BACKGROUND ART

In a manufacturing process of an electronic device such as a semiconductor device, plasma processing of a workpiece may be performed using a plasma processing apparatus, and plasma etching is one kind of plasma processing. A resist mask used for plasma etching is formed by a photolithography technique, and a critical dimension of a pattern formed in an etching target layer depends on the resolution of the resist mask formed by the photolithography technique. However, the resolution of the resist mask has a resolution limit. There is an increasing demand for higher integration of electronic devices, and it is now required to form patterns with dimensions smaller than the resolution limit of resist mask. Therefore, as described in Patent Document 1, a technique of adjusting the dimensions of a resist mask by forming a silicon oxide film on the resist mask, and reducing the width of an opening provided by the resist mask has been proposed.

CITATION LIST

Patent Document

[Patent Document 1] Japanese Unexamined Patent Publication No. 2004-80033

SUMMARY OF INVENTION

Technical Problem

Meanwhile, with miniaturization due to high integration of electronic devices in recent years, control of a critical dimension (CD) with high precision is required for pattern formation on a workpiece. Furthermore, from the viewpoint of mass productivity of electronic devices, long-term stable reproducibility of a critical dimension and the like are also required. In particular, in a case where processing of, for example, an organic film and the like included in a laminated structure proceeds, the pattern shape of the organic film and the like cannot be maintained and the CD may change before and after the processing in some cases. Therefore, it is desirable to realize a technique capable of controlling a pattern shape during processing of an organic film and the like.

Solution to Problem

According to an aspect, a method for processing a workpiece is provided. The workpiece includes an etching target layer, an organic film provided on the etching target layer, and a mask provided on the organic film, the organic film is constituted by a first region and a second region, the mask is provided on the first region, the first region is provided on the second region, the second region is provided on the etching target layer. The method includes: a step of generating a plasma of a first gas in a processing container of a plasma processing apparatus in which the workpiece is accommodated, etching the first region to reach the second region using the plasma and the mask, and conformally forming a protective film on a side surface of the first region (referred to as a step a); and a step of etching the second region to reach the etching target layer while maintaining a shape of the first region using the protective film (referred to as a step b).

In the method, the step of etching the organic film is divided into the two steps (the step included in the step a) and the step b. In the first step (the step included in the step a) of etching the organic film, the first region in the organic film is etched by the plasma of the first gas, the protective film is formed on the side surface of the first region in advance (the step a), and thereafter, in the second step b of etching the organic film, the second region remaining in the organic film is etched to reach the etching target layer using the first region and the protective film while maintaining the shape of the first region. As described above, in the etching of the organic film, in the step b, a reduction in the width of the first region due to the etching can be suppressed by the protective film, so that the width of the second region can be controlled independently from the width of the first region in the step b. That is, the Top CD (corresponding to the width of the upper end of the first region) and the Bottom CD (corresponding to the width of the second region) of the organic film can be independently controlled.

In an embodiment, the first gas may contain hydrogen gas and nitrogen gas. As described above, the etching of the organic film can be performed with good verticality by the plasma of the first gas containing hydrogen gas and nitrogen gas, so that variation of the pattern width due to the etching can be suppressed.

In the embodiment, the protective film may be an oxide film. As described above, since the protective film is an oxide film, in a case where etching with high selectivity with respect to the oxide film is performed on the second region, the etching amount of the second region (especially, the etching amount in a direction along the surface of the etching target layer) can be favorably controlled.

In the embodiment, in the step a, after the first region is etched to reach the second region, the protective film is conformally formed on the side surface of the first region by repeatedly executing a sequence including a step of supplying a second gas into the processing container (referred to as a step c), a step of purging a space in the processing container after executing the step c (referred to as a step d), a step of generating a plasma of a third gas in the processing container after executing the step d (referred to as a step e), and a step of purging the space in the processing container after executing the step e. In addition, in the step c, a plasma of the second gas is not generated. As described above, in the step a, since the protective film is conformally formed on the side surface of the first region by a method similar to the ALD (Atomic Layer Deposition) method, the protection of the first region is improved, and the protective film protecting the first region can be formed into a uniform film thickness.

In the embodiment, the second gas may contain an aminosilane-based gas. As described above, since the second gas contains the aminosilane-based gas, the reaction precursor of silicon is formed on the first region and the like along the atomic layer of the side surface of the first region and the like by the step c.

In the embodiment, the second gas may contain a monoaminosilane. Therefore, formation of the reaction precursor of silicon can be performed in the step c using the second gas containing monoaminosilane.

In the embodiment, the aminosilane-based gas contained in the second gas may contain an aminosilane having 1 to 3 silicon atoms. The aminosilane-based gas contained in the second gas may contain an aminosilane having 1 to 3 amino groups. As described above, as the aminosilane-based gas contained in the second gas, an aminosilane having 1 to 3 silicon atoms can be used. Alternatively, as the aminosilane-based gas contained in the second gas, an aminosilane having 1 to 3 amino groups can be used.

In the embodiment, the third gas may contain an oxygen atom. For example, the third gas may contain carbon dioxide gas or oxygen gas. As described above, since the third gas contains oxygen atoms, in the step e, the oxygen atoms are bonded to the reaction precursor of silicon provided on the first region and the like, so that the protective film of silicon oxide can be conformally formed on the first region and the like. In a case where the third gas is carbon dioxide gas, since the third gas contains carbon atoms, erosion of the first region and the like by the oxygen atoms can be suppressed by the carbon atoms.

In the embodiment, the step a may further include a step of generating a plasma of a fourth gas in the processing container after repeatedly executing the sequence, and removing a film formed on a surface of the second region by repeatedly executing the sequence, using the plasma. In addition, the fourth gas may contain fluorine. As described above, etching of the film formed by repeatedly executing the sequence is anisotropically performed using the plasma of the fourth gas containing fluorine, and thus the film formed on the surface of the second region can be selectively removed, so that etching of the second region can be performed after the removal.

In the embodiment, in the step b, a plasma of a fifth gas may be generated in the processing container, and the second region may be etched using the plasma, the first region, and the protective film. As described above, in the step b, etching of the second region can be performed using the plasma of the fifth gas.

In the embodiment, the step b may include a term in which a pressure in the processing container has reached a first pressure, and a term thereafter in which the pressure in the processing container has reached a second pressure. In addition, the second pressure may be higher than the first pressure. As described above, in the step b, by increasing the pressure in the processing container, the etching of the second region can proceed in a direction along the surface of the etching target layer. Therefore, the width of the second region can be suitably controlled in the step b.

In the embodiment, the fifth gas may contain oxygen gas. As described above, since the fifth gas contains oxygen gas, etching of the organic film, particularly the organic film in the direction along the surface of the etching target layer can be favorably performed.

In the embodiment, the step a may include, after the first region is etched to reach the second region and before the protective film is conformally formed on the side surface of the first region, a step of irradiating the first region with secondary electrons by generating a plasma in the processing container and applying a negative DC voltage to an upper electrode provided in the processing container. As described above, in the step a, after the first region is etched to reach the second region, the first region is irradiated with secondary electrons, so that the first region can be modified before forming the protective. Therefore, damage to the first region due to the subsequent step can be suppressed.

In the embodiment, a thickness of the second region is 10 nm or more and 20 nm or less before executing the step b. As described above, when the thickness of the second region is 10 nm or more and 20 nm or less, the width of the second region can be favorably controlled in the step b.

Advantageous Effects of Invention

As described above, a technique capable of controlling a pattern shape during processing of an organic film and the like can be realized.

DESCRIPTION OF EMBODIMENTS

Figure 1:
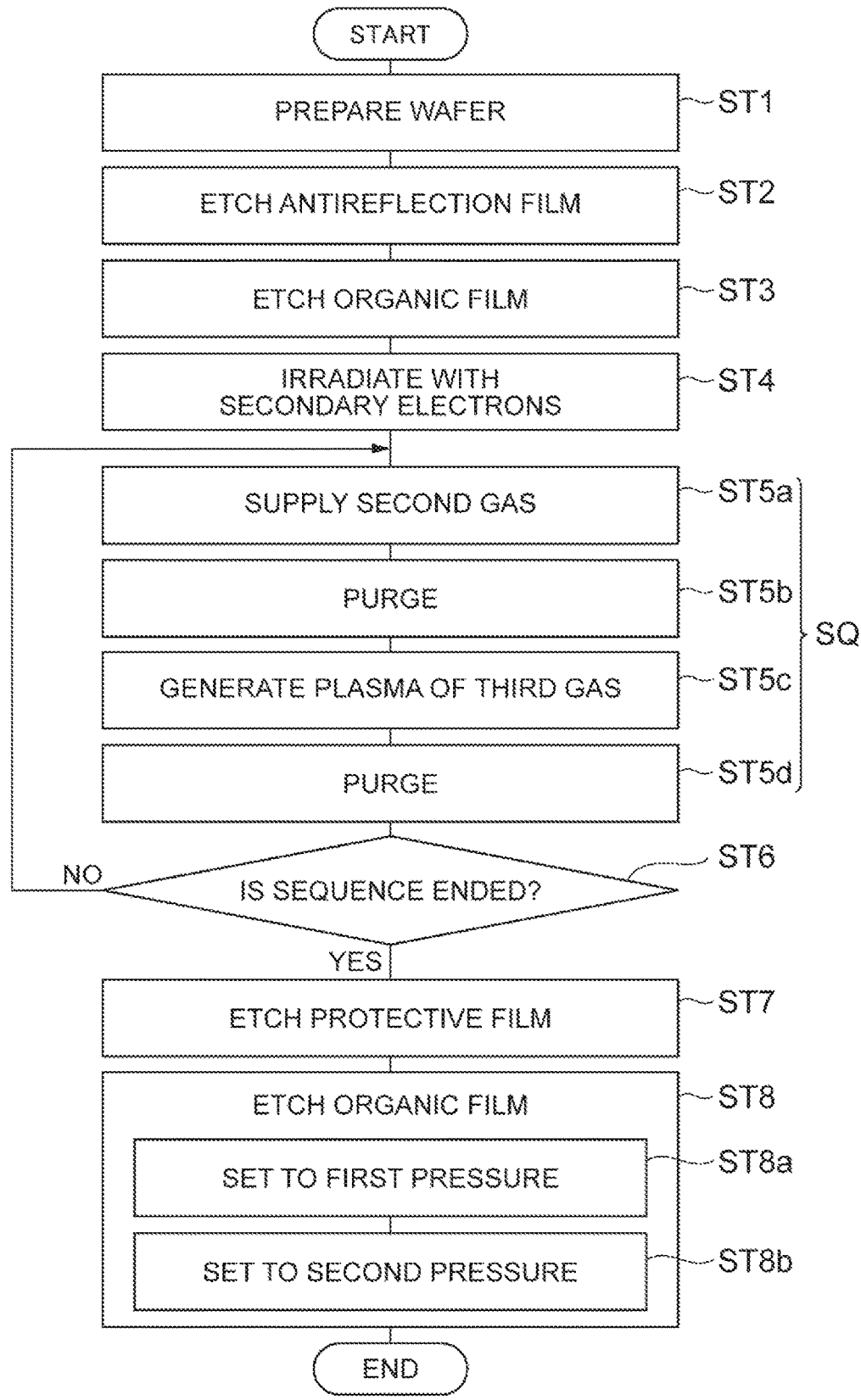
FIG. 1 is a flowchart showing a portion of a method according to an embodiment.

Hereinafter, various embodiments will be described in detail with reference to the drawings. In addition, in each of the drawings, like elements which are the same or similar are denoted by like reference numerals.

FIG. 1 is a flowchart showing a method of an embodiment. A method MT of the embodiment shown in FIG. 1 is a method for processing a workpiece (hereinafter, sometimes referred to as "wafer"). As shown in FIG. 1, the method MT includes steps ST1 to ST4, a sequence SQ, and steps ST6 to ST8. The sequence SQ includes steps ST5a to ST5d. In addition, the method MT of the embodiment can be executed using a single plasma processing apparatus (a plasma processing apparatus 10, which will be described later). However, a plurality of plasma processing apparatuses 10 can also be used depending on each of the steps of the method MT.

Figure 2:
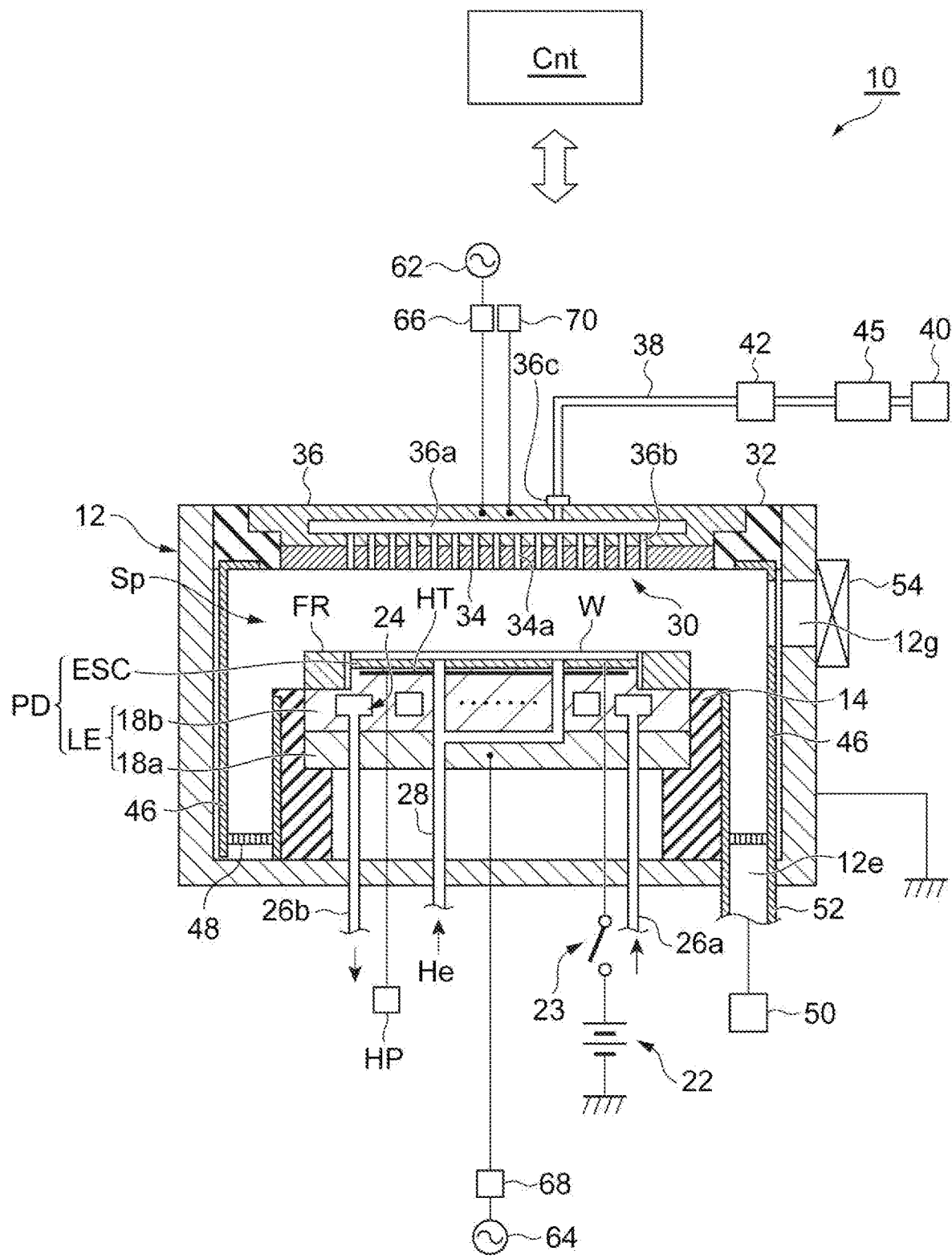
FIG. 2 is a view illustrating an example of a plasma processing apparatus.

FIG. 2 is a view illustrating an example of the plasma processing apparatus. FIG. 2 schematically illustrates a sectional structure of the plasma processing apparatus 10 which can be used in various embodiments of the method for processing a workpiece. As illustrated in FIG. 2, the plasma processing apparatus 10 is a capacitive coupling type plasma etching apparatus.

The plasma processing apparatus 10 includes a processing container 12, an exhaust port 12e, an import and export port 12g, a support portion 14, a placing table PD, a DC power source 22, a switch 23, a refrigerant flow passage 24, a pipe 26a, a pipe 26b, an upper electrode 30, an insulating shield member 32, an electrode plate 34, gas discharge holes 34a, an electrode support body 36, a gas diffusion chamber 36a, gas flow holes 36b, a gas introduction port 36c, a gas supply pipe 38, a gas source group 40, a valve group 42, a flow rate controller group 45, a deposit shield 46, an exhaust plate 48, an exhaust device 50, an exhaust pipe 52, a gate valve 54, a first radio frequency power source 62, a second radio frequency power source 64, a matching device 66, a matching device 68, a power source 70, a controller Cnt, a focus ring FR, a heater power source HP, and a heater HT. The placing table PD includes an electrostatic chuck ESC, and a lower electrode LE. The lower electrode LE includes a first plate 18a and a second plate 18b. The processing container 12 defines a processing space Sp.

The processing container 12 has a substantially cylindrical shape. For example, the processing container 12 is formed of aluminum. The inner wall surface of the processing container 12 is subjected to an anodic oxidation treatment. The processing container 12 is grounded for safety.

The support portion 14 is provided on the bottom portion of the processing container 12 on the inside of the processing container 12. The support portion 14 has a substantially cylindrical shape. For example, the support portion 14 is formed of an insulating material. The insulating material forming the support portion 14 may contain oxygen like quartz. The support portion 14 extends in the vertical direction from the bottom portion of the processing container 12 in the processing container 12.

The placing table PD is provided in the processing container 12. The placing table PD is supported by the support portion 14. The placing table PD holds a wafer W on the upper surface of the placing table PD. The wafer W is a workpiece. The placing table PD includes the lower electrode LE and the electrostatic chuck ESC.

The lower electrode LE includes the first plate 18a and the second plate 18b. The first plate 18a and the second plate 18b are formed of metal such as aluminum. The first plate 18a and the second plate 18b have substantially disk shapes. The second plate 18b is provided on the first plate 18a. The second plate 18b is electrically connected to the first plate 18a.

The electrostatic chuck ESC is provided on the second plate 18b. The electrostatic chuck ESC has a structure in which an electrode of a conductive film is disposed between a pair of insulating layers or between a pair of insulating sheets. The DC power source 22 is electrically connected to an electrode of the electrostatic chuck ESC via a switch 23. The electrostatic chuck ESC causes the wafer W to be adsorbed thereon by an electrostatic force such as the Coulomb force generated by a DC voltage applied from the DC power source 22. Accordingly, the electrostatic chuck ESC can hold the wafer W.

The focus ring FR is disposed on the circumferential edge portion of the second plate 18b so as to surround the edge of the wafer W and the electrostatic chuck ESC. The focus ring FR is provided to improve the uniformity of etching. The focus ring FR is formed of a material which is appropriately selected depending on the material of a film as an etching object, and for example, may be formed of quartz.

The refrigerant flow passage 24 is provided in the inner portion of the second plate 18b. The refrigerant flow passage 24 forms a temperature adjusting mechanism. A refrigerant is supplied to the refrigerant flow passage 24 via the pipe 26a from a chiller unit provided on the outside of the processing container 12. The refrigerant supplied to the refrigerant flow passage 24 is returned to the chiller unit via the pipe 26b. As described above, the refrigerant is supplied to the refrigerant flow passage 24 so as to be circulated. By controlling the temperature of the refrigerant, the temperature of the wafer W supplied by the electrostatic chuck ESC is controlled. A gas supply line 28 supplies a heat transfer gas, for example, He gas from a heat transfer gas supply mechanism between the upper surface of the electrostatic chuck ESC and the rear surface of the wafer W.

The heater HT is a heating element. For example, the heater HT is buried in the second plate 18b. The heater power source HP is connected to the heater HT. As power is supplied from the heater power source HP to the heater HT, the temperature of the placing table PD is adjusted, and the temperature of the wafer W placed on the placing table PD is adjusted. In addition, the heater HT may be embedded in the electrostatic chuck ESC.

The upper electrode 30 is disposed above the placing table PD to oppose the placing table PD. The lower electrode LE and the upper electrode 30 are provided substantially in parallel to each other. The processing space Sp is provided between the upper electrode 30 and the lower electrode LE. The processing space Sp is a spatial region for performing plasma processing on the wafer W.

The upper electrode 30 is supported at the upper portion of the processing container 12 via the insulating shield member 32. The insulating shield member 32 is formed of an insulating material, and for example, may contain oxygen like quartz. The upper electrode 30 may include the electrode plate 34 and the electrode support body 36. The electrode plate 34 faces the processing space Sp. The electrode plate 34 includes a plurality of the gas discharge holes 34a. In the embodiment, the electrode plate 34 may be formed of silicon. In another embodiment, the electrode plate 34 may be formed of silicon oxide.

The electrode support body 36 detachably supports the electrode plate 34 and for example, may be formed of a conductive material such as aluminum. The electrode support body 36 may have a water-cooled structure. The gas diffusion chamber 36a is provided in the electrode support body 36. Each of a plurality of the gas flow holes 36b communicates with the gas discharge hole 34a. Each of the plurality of gas flow holes 36b extends downward (toward the placing table PD side) from the gas diffusion chamber 36a.

The gas introduction port 36c introduces a processing gas to the gas diffusion chamber 36a. The gas introduction port 36c is provided in the electrode support body 36. The gas supply pipe 38 is connected to the gas introduction port 36c.

The gas source group 40 is connected to the gas supply pipe 38 via the valve group 42 and the flow rate controller group 45. The gas source group 40 includes a plurality of gas sources. The plurality of gas sources may include a source of an aminosilane-based gas, a source of oxygen gas, a source of hydrogen gas, a source of nitrogen gas, a source of carbon dioxide gas, a source of a fluorocarbon gas, and a source of a noble gas. As the aminosilane-based gas (a gas contained in a second gas G1, which will be described later), a gas having a molecular structure with a relatively small number of amino groups can be used, and for example, a monoaminosilane ($H_3$—Si—R (R is an amino group which contains a hydrocarbyl and can be substituted)) can be used. The aminosilane-based gas (the gas contained in the second gas G1, which will be described later) may include an aminosilane which can have 1 to 3 silicon atoms, or an aminosilane having 1 to 3 amino groups. The aminosilane having 1 to 3 silicon atoms may be a monosilane (monoaminosilane) having 1 to 3 amino groups, a disilane having 1 to 3 amino groups, or a trisilane having 1 to 3 amino groups. Furthermore, the aminosilane may have an amino group which may be substituted. In addition, the amino group may be substituted by any of a methyl group, an ethyl group, a propyl group, and a butyl group. Furthermore, the methyl group, the ethyl group, the propyl group, and the butyl group may be substituted by a halogen. As the fluorocarbon gas, any fluorocarbon gas such as $CF_4$ gas, $C_4F_6$ gas, or $C_4F_8$ gas can be used. As the noble gas, any noble gas such as He gas or Ar gas can be used.

The valve group 42 includes a plurality of valves. The flow rate controller group 45 includes a plurality of flow rate controllers called mass flow controllers. Each of the plurality of gas sources of the gas source group 40 is connected to the gas supply pipe 38 via a corresponding valve of the valve group 42 and a corresponding flow rate controller of the flow rate controller group 45. Therefore, the plasma processing apparatus 10 can supply gases from one or more gas sources selected from among the plurality of gas sources of the gas source group 40 into the processing container 12 at individually adjusted flow rates. In addition, in the plasma processing apparatus 10, the deposit shield 46 is detachably provided along the inner wall of the processing container 12. The deposit shield 46 is also provided on the outer circumference of the support portion 14. The deposit shield 46 is for preventing the adhesion of etching by-products (deposits) to the processing container 12 and may be formed by coating an aluminum material with ceramic such as $Y_2O_3$. For example, the deposit shield may be formed of a material containing oxygen like quartz other than $Y_2O_3$.

The exhaust plate 48 is provided on the bottom portion side of the processing container 12 between the support portion 14 and the side wall of the processing container 12. For example, the exhaust plate 48 may be formed by coating an aluminum material with ceramic such as $Y_2O_3$. The exhaust port 12e is provided in the processing container 12 on the lower side of the exhaust plate 48. The exhaust device 50 is connected to the exhaust port 12e via the exhaust pipe 52. The exhaust device 50 includes a vacuum pump such as a turbomolecular pump and can reduce the pressure of the space in the processing container 12 to a desired degree of vacuum. The import and export port 12g is an import and export port of the wafer W. The import and export port 12g is provided in the side wall of the processing container 12. The import and export port 12g can be opened and closed by the gate valve 54.

The first radio frequency power source 62 is a power source for generating first radio frequency power for plasma generation and generates radio frequency power at a frequency of 27 to 100 [MHz], as an example, 40 [MHz]. The first radio frequency power source 62 is connected to the upper electrode 30 via the matching device 66. The matching device 66 is a circuit for matching the output impedance of the first radio frequency power source 62 and the input impedance of a load side (the lower electrode LE side). In addition, the first radio frequency power source 62 may also be connected to the lower electrode LE via the matching device 66.

The second radio frequency power source 64 is a power source for generating second radio frequency power for attracting ions toward the wafer W, that is, radio frequency bias power, and generates radio frequency bias power at a frequency in a range of 400 [kHz] to 40.68 [MHz], as an example, 3.2 [MHz]. The second radio frequency power source 64 is connected to the lower electrode LE via the matching device 68. The matching device 68 is a circuit for matching the output impedance of the second radio frequency power source 64 and the input impedance of the load side (the lower electrode LE side). The power source 70 is connected to the upper electrode 30. The power source 70 applies a voltage for attracting positive ions that exist in the processing space Sp toward the electrode plate 34 to the upper electrode 30. As an example, the power source 70 is a DC power source that generates a negative DC voltage. When the voltage is applied from the power source 70 to the upper electrode 30, the positive ions that exist in the processing space Sp collide with the electrode plate 34. Accordingly, secondary electrons and/or silicon are emitted from the electrode plate 34.

The controller Cnt is a computer provided with a processor, a storage unit, an input device, a display device, and the like and controls each unit of the plasma processing apparatus 10. Specifically, the controller Cnt is connected to the valve group 42, the flow rate controller group 45, the exhaust device 50, the first radio frequency power source 62, the matching device 66, the second radio frequency power source 64, the matching device 68, the power source 70, the heater power source HP, and the chiller unit.

The controller Cnt is operated according to programs based on an input recipe and transmits control signals. According to the control signals from the controller Cnt, the selection of gases supplied from the gas source group and the flow rates thereof, the exhaust from the exhaust device 50, the supply of power from the first radio frequency power source 62 and the second radio frequency power source 64, the application of a voltage from the power source 70, the supply of power from the heater power source HP, and the flow rate and the temperature of the refrigerant from the chiller unit can be controlled. Each process in the method for processing a workpiece (the method MT shown in FIG. 1) disclosed in this specification may be executed by operating each unit of the plasma processing apparatus 10 according to the control by the controller Cnt.

Figure 3:
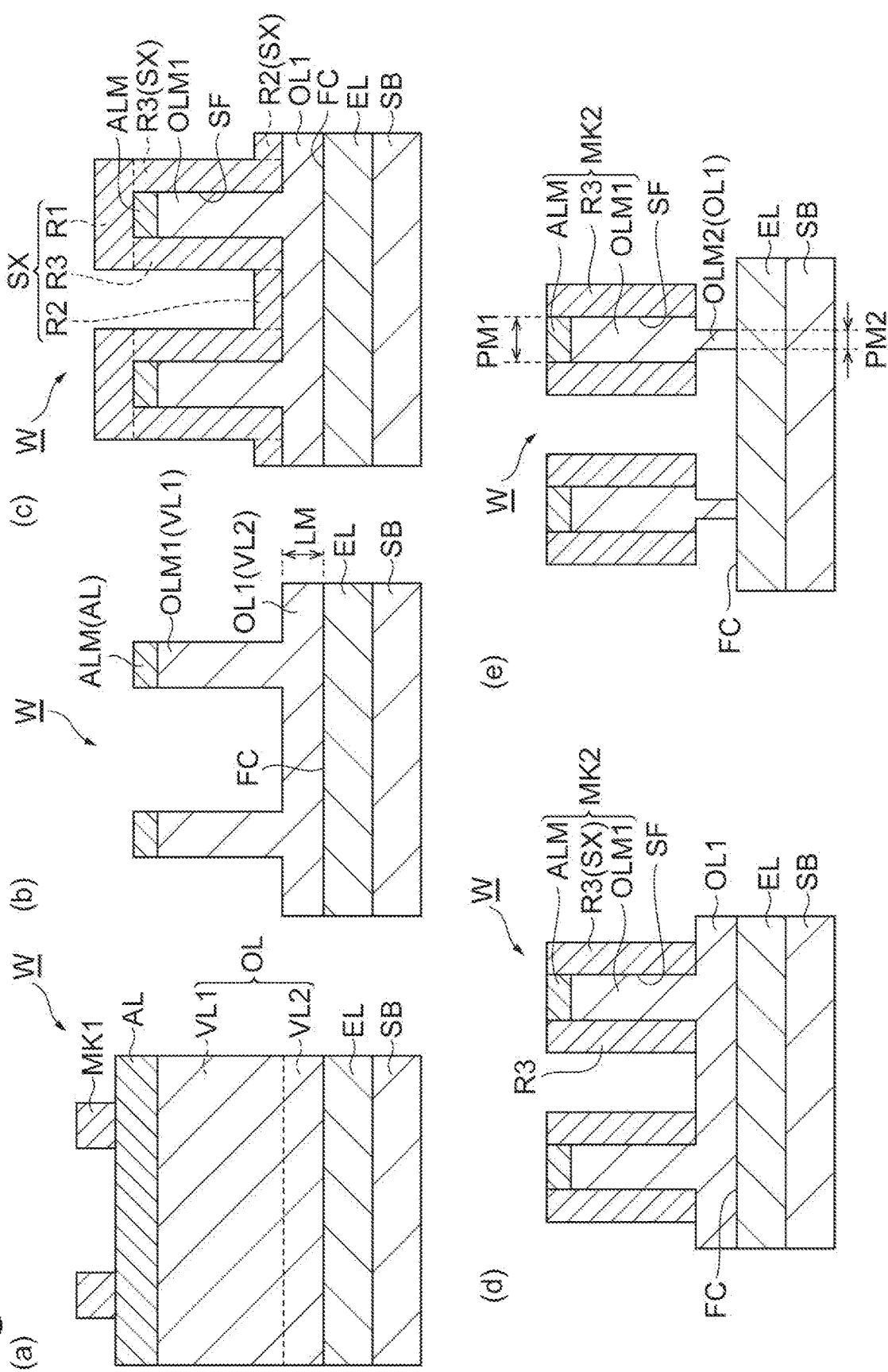
FIG. 3 includes parts (a), (b), (c), (d), and (e), in which part (a) is a sectional view illustrating a state of a workpiece before executing a main step shown in FIG. 1, and parts (b) to (e) are sectional views illustrating states of the workpiece after executing the main step shown in FIG. 1.
Figure 4:
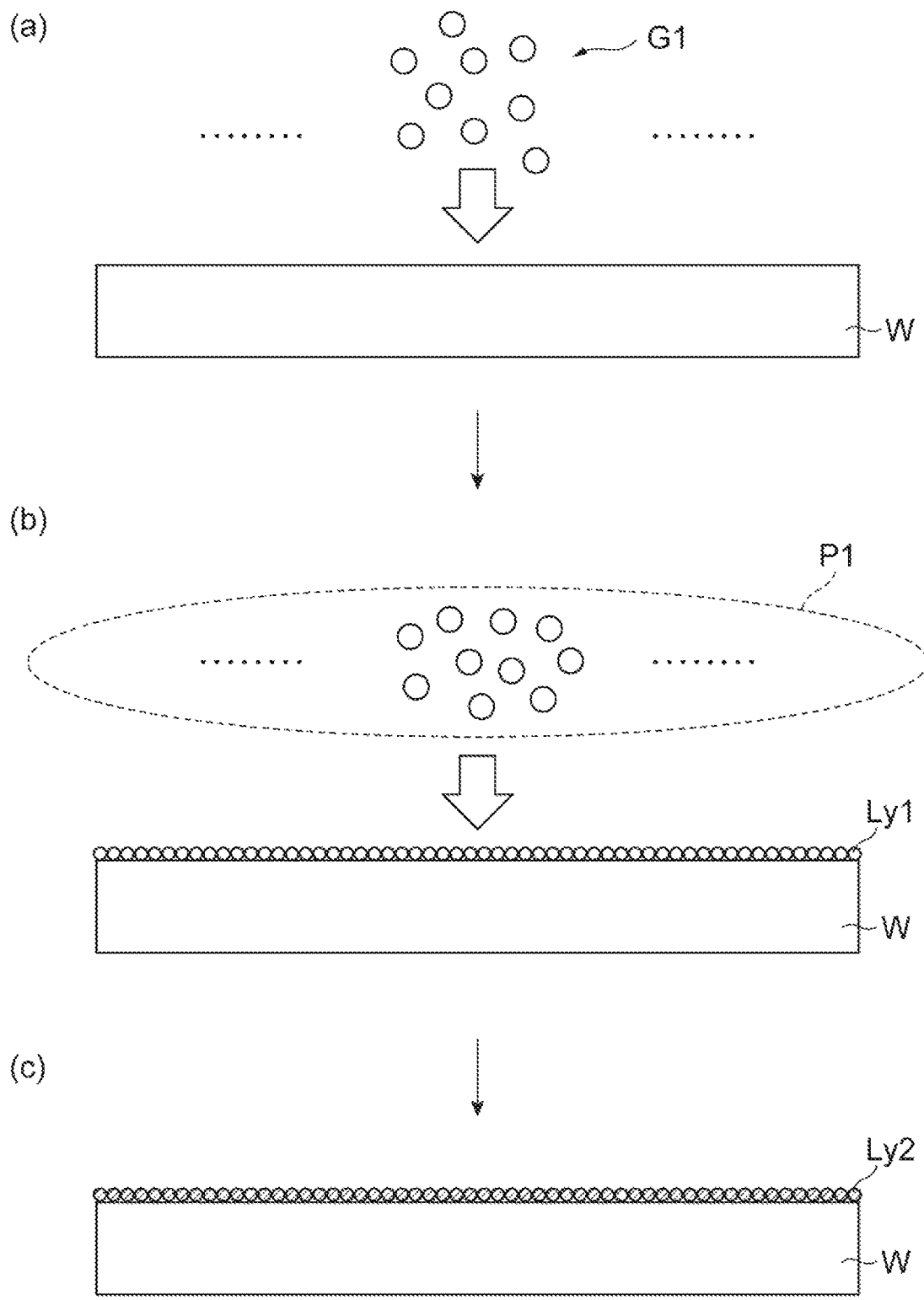
FIG. 4 includes parts (a), (b), and (c), in which parts (a) to (c) schematically illustrate a procedure in which a film is formed by executing a sequence shown in FIG. 1.

Next, the method MT according to the embodiment will be described in detail with reference to FIG. 1. In the following description, FIGS. 3 and 4 are referred to together with FIGS. 1 and 2. Part (a) in FIG. 3 is a sectional view illustrating a state of the workpiece before executing main steps shown in FIG. 1. Parts (b) to (e) in FIG. 3 are sectional views illustrating states of the workpiece after executing the main steps shown in FIG. 1. Parts (a) to (c) in FIG. 4 schematically illustrate a procedure in which a film is formed by executing the sequence shown in FIG. 1.

In the step ST1, a wafer W illustrated in part (a) in FIG. 3 is prepared as the wafer W illustrated in FIG. 2. In the step ST1, the wafer W illustrated in part (a) in FIG. 3 is prepared, and the wafer W is accommodated in the processing container 12 of the plasma processing apparatus 10 and is placed on the placing table PD. As illustrated in part (a) in FIG. 3, the wafer W prepared in the process ST1 includes a substrate SB, an etching target layer EL, an organic film OL, an antireflection film AL, and a mask MK1.

The etching target layer EL is placed on the substrate SB. The etching target layer EL is a layer formed of a material which is selectively etched with respect to the organic film OL, and an insulating film is used. The etching target layer EL can be formed of, for example, silicon oxide ($SiO_2$). The etching target layer EL can also be formed of another material such as polycrystalline silicon or silicon nitride (SiN).

The organic film OL is provided on the etching target layer EL. The organic film OL may be, for example, a layer containing carbon or silicon and may be a SOH (spin-on hardmask) layer. The organic film OL is not limited to the SOH mentioned above as long as the organic film OL can be selectively etched with respect to the material (silicon oxide film) of a protective film SX, which will be described later. For example, the material of the organic film OL may be SiN, polycrystalline silicon, or amorphous silicon, other than the SOH mentioned above. The antireflection film AL is a silicon-containing antireflection film and is provided on the organic film OL.

In the following description, for convenience, the organic film OL is divided into a first region VL1 and a second region VL2. That is, the organic film OL is constituted by the first region VL1 and the second region VL2. The boundary surface between the first region VL1 and the second region VL2 is not a physical surface but a virtual surface. The first region VL1 and the second region VL2 are made of the same material and extend along the surface of the wafer W. The thickness LM of the second region VL2 is, for example, about 10 [nm] or more and 20 [nm] or less. The mask MK1 is provided on the first region VL1, the first region VL1 is provided on the second region VL2, and the second region VL2 is provided on the etching target layer EL.

The mask MK 1 is provided on the antireflection film AL. The mask MK1 is a resist mask formed of a resist material, and is manufactured by patterning a resist layer by a photolithography technique. The mask MK 1 partially covers the antireflection film AL. The mask MK 1 defines openings (pattern) that partially expose the antireflection film AL. The pattern of the mask MK1 is, for example, a line-and-space pattern. The mask MK1 may have a pattern that provides a circular opening in a plan view. Alternatively, the mask MK1 may have a pattern that provides an elliptical opening in the plan view.

In the step ST2 subsequent to the step ST1, the antireflection film AL is etched. Specifically, a processing gas containing the fluorocarbon gas is supplied into the processing container 12 from a gas source selected from among the plurality of gas sources of the gas source group 40. In addition, radio frequency power is supplied from the first radio frequency power source 62. Radio frequency bias power is supplied from the second radio frequency power source 64. By operating the exhaust device 50, the pressure of the space in the processing container 12 is set to a predetermined pressure. Accordingly, a plasma of the processing gas containing the fluorocarbon gas is generated. Active species containing fluorine in the generated plasma cause a region of the entire region of the antireflection film AL exposed from the mask MK1 to be etched. Accordingly, a mask ALM is formed from the antireflection film AL. The mask ALM is used as a mask for etching the organic film OL.

In the step ST3 subsequent to the step ST2, a plasma of a first gas is generated in the processing container 12 of the plasma processing apparatus 10 in which the wafer W is accommodated, and the first region VL1 is etched to reach the second region VL2 using the plasma and the mask ALM, such that a mask OLM1 is formed from the first region VL1. Specifically, as the processing gas, the first gas containing hydrogen gas and nitrogen gas is supplied into the processing container 12 from gas sources selected from among the plurality of gas sources of the gas source group 40. In addition, radio frequency power is supplied from the first radio frequency power source 62. Radio frequency bias power is supplied from the second radio frequency power source 64. By operating the exhaust device 50, the pressure in the processing container 12 is set to a predetermined pressure. In this manner, the plasma of the first gas is generated in the processing space Sp of the processing container 12. Hydrogen radicals which are active species of hydrogen in the generated plasma cause a region of the entire region of the organic film OL exposed from the mask ALM formed from the antireflection film AL in the step ST2 to be etched.

As illustrated in part (b) in FIG. 3, in the step ST3, the first region VL1 in the organic film OL is etched, that is, the organic film OL is etched to reach a thickness LM from the interface between the organic film OL and the etching target layer EL (a surface FC of the etching target layer EL). In other words, in the step ST3, the organic film OL is etched to leave the thickness LM, that is, to leave the second region VL2. The mask OLM1 and an organic film OL1 are formed from the organic film OL by the step ST3. The organic film OL1 is a portion which is not etched but left in the organic film OL in the step ST3, and is the second region VL2 of the organic film OL. The organic film OL1 is provided on the surface FC of the etching target layer EL. The organic film OL1 has the thickness LM. The mask OLM1 is provided on the organic film OL1. The mask ALM and the mask OLM1 are used as a mask for etching of the organic film OL1. In addition, since both protection of the side surface of the first region VL1 of the organic film OL and etching of the organic film OL can be achieved by the first gas containing hydrogen gas and nitrogen gas, the verticality of the mask OLM1 formed from the first region VL1 of the organic film OL can be favorably realized by the step ST3.

In a step ST4 subsequent to the step ST3, in a series of steps (a series of steps from the step ST3 to the step ST7) of conformally forming the protective film SX on a side surface SF of the mask OLM1, after the first region VL1 of the organic film OL is etched to reach the second region VL2 (after the step ST3) and before the protective film SX is conformally formed on the side surface SF of the mask OLM1, by generating a plasma in the processing container 12 and applying a negative DC voltage to the upper electrode 30 of the processing container 12, the surface of the mask ALM and the side surface SF of the mask OLM1 are irradiated with secondary electrons, thereby forming a protective film of silicon oxide. In the method MT, a step ST5a (the sequence SQ) can be executed after executing the step ST3 without executing the step ST4.

Subsequent to the step ST4, in the method MT shown in FIG. 1, the sequence SQ is executed one or more times. After the execution of the step ST4, a series of steps from the start of the sequence SQ to the step ST7, which will be described later, are steps for conformally forming the protective film SX on the side surface SF of the mask OLM1. The sequence SQ includes the step ST5a, a step ST5b, a step ST5c, and a step ST5d.

First, in the step ST5a, the second gas G1 containing silicon is introduced into the processing container 12. The second gas G1 contains the aminosilane-based gas. The second gas G1 is supplied into the processing container 12 from a gas source selected from among the plurality of gas sources of the gas source group 40. The second gas G1 uses monoaminosilane ($H_3$—Si—R (R is an amino group)) as the aminosilane-based gas. In the step ST5a, a plasma of the second gas G1 is not generated.

As illustrated in part (a) in FIG. 4, molecules of the second gas G1 adhere to the surface of the wafer W as a reaction precursor. The molecules (monoaminosilane) of the second gas G1 adhere to the surface of the wafer W by chemical adsorption based on chemical bonding, and plasma is not used. It is also possible to use a gas other than monoaminosilane as long as the gas can adhere to the surface by chemical bonding in a corresponding temperature range and contains silicon.

The reason why the monoaminosilane-based gas is selected as the second gas G1 is that monoaminosilane has relatively high electronegativity and has a molecular structure with polarity and thus chemical adsorption can be relatively easily performed. A layer Ly1 formed by the molecules of the second gas G1 adhering to the surface of the wafer W is in a state close to a monomolecular layer (monolayer) because the adhesion is chemical adsorption. The smaller the amino group (R) of the monoaminosilane, the smaller the molecular structure of the molecule adsorbed onto the surface of the wafer W. Therefore, steric hindrance due to the size of the molecule decreases, and thus the molecules of the second gas G1 can uniformly adsorb onto the surface of the wafer W. Accordingly, the layer Ly1 can be framed into a uniform film thickness on the surface of the wafer W. For example, as the monoaminosilane ($H_3$—Si—R) contained in the second gas G1 reacts with OH groups of the surface of the wafer W, $H_3$—Si—O of the reaction precursor is formed, so that the layer Ly1 which is a monomolecular layer of $H_3$—Si—O is formed. Therefore, the layer Ly1 of the reaction precursor can be conformally formed into a uniform film thickness on the surface of the wafer W without depending on the density of the pattern of the wafer W.

In the step ST5b subsequent to the step ST5a, the space in the processing container 12 is purged. Specifically, the second gas G1 supplied in the step ST5a is discharged. In the step ST5b, an inert gas such as nitrogen gas as a purge gas may be supplied to the processing container 12. That is, purging performed in the step ST5b may be either gas purging in which an inert gas is caused to flow into the processing container 12 or purging through evacuation. In the step ST5b, excessively adhering molecules on the wafer W can also be removed. Accordingly, the layer Ly1 of the reaction precursor becomes an extremely thin monomolecular layer.

In the step ST5c subsequent to the step ST5b, a plasma P1 of a third gas is generated in the processing container 12. Specifically, the third gas containing carbon dioxide gas is supplied into the processing container 12 from a gas source selected from among the plurality of gas sources of the gas source group 40. The third gas may be other gases containing oxygen atoms than carbon dioxide gas, and for example, may be oxygen gas. In addition, radio frequency power is supplied from the first radio frequency power source 62. In this case, bias power may be supplied from the second radio frequency power source 64. Alternatively, the plasma may also be generated using only the second radio frequency power source 64 without using the first radio frequency power source 62. By operating the exhaust device 50, the pressure of the space in the processing container 12 is set to a predetermined pressure.

The molecules (the molecules constituting the monomolecular layer of the layer Ly1) adhered to the surface of the wafer W by the execution of the step ST5a as described above contain silicon-oxygen bonds. The binding energy of the silicon-oxygen bonds is lower than the binding energy of silicon-oxygen bonds. Therefore, as illustrated in part (b) in FIG. 4, when the plasma P1 of the third gas containing carbon dioxide gas is generated, active species of oxygen, for example, oxygen radicals are generated such that hydrogen atoms of the molecules constituting the monomolecular layer of the layer Ly1 are substituted with oxygen atoms. Accordingly, as illustrated in part (c) in FIG. 4, a layer Ly2 which is a silicon oxide layer is formed as a monomolecular layer.

In the step ST5d subsequent to the step ST5c, the space in the processing container 12 is purged. Specifically, the third gas supplied in the step ST5c is discharged. In the step ST5d, an inert gas such as nitrogen gas as a purge gas may be supplied to the processing container 12. That is, purging performed in the step ST5d may be either gas purging in which an inert gas is caused to flow into the processing container 12 or purging through evacuation.

In the sequence SQ described above, purging is performed in the step ST5b, and hydrogen atoms in the molecules constituting the layer Ly1 are substituted with oxygen atoms in the step ST5c subsequent to the step ST5b. Therefore, similarly to the ALD method, by executing the sequence SQ once, the layer Ly2 of the silicon oxide film can conformally formed into a thin and uniform thickness on the surface of the wafer W (particularly on the side surface SF of the mask OLM1) regardless of the density of the pattern of the mask MK1.

In the step ST6 subsequent to the sequence SQ, it is determined whether or not the execution of the sequence SQ is ended. Specifically, in the step ST6, it is determined whether or not the number of times of execution of the sequence SQ has reached a predetermined number. The determination of the number of times of execution of the sequence SQ is to determine the thickness of the protective film SX of the silicon oxide film formed on the wafer W (particularly on the side surface SF of the mask OLM1) illustrated in part (c) in FIG. 3. That is, the thickness of the protective film SX finally formed on the wafer W is substantially determined by the product of the film thickness of the silicon oxide film formed by executing the sequence SQ once and the number of times of execution of the sequence SQ. Therefore, the number of times of execution of the sequence SQ is set according to the desired thickness of the protective film SX famed on the wafer W.

In a case where it is determined in the step ST6 that the number of times of execution of the sequence SQ has not reached the predetermined number (NO in the step ST6), the execution of the sequence SQ is repeated again. On the other hand, in a case where it is determined that the number of times of execution of the sequence SQ has reached the predetermined number in the step ST6 (YES in the step ST6), the execution of the sequence SQ is ended. Accordingly, as illustrated in part (c) in FIG. 3, the protective film SX of the silicon oxide film is formed on the surface of the wafer W (particularly on the side surface SF of the mask OLM1). That is, by repeating the sequence SQ so that the number of times of execution of the sequence SQ reaches the predetermined number, the protective film SX having a predetermined film thickness is conformally formed into a uniform film on the surface of the wafer W (particularly on the side surface SF of the mask OLM1) regardless of the density of the pattern of the mask MK1. The thickness of the protective film SX on the side surface SF of the mask OLM1 decreases as the number of times of execution of the sequence SQ decreases. The thickness of the protective film SX on the side surface SF of the mask OLM1 decreases from the upper end of the mask OLM1 (one end of the mask OLM1 on the side on which the mask ALM is provided) toward the lower end of the mask OLM1 (the other end of the mask OLM1 on the side on which the organic film OL1 is provided).

As illustrated in part (c) in FIG. 3, the protective film SX includes a region R1, a region R2, and a region R3. The region R3 is a region extending on the side surface of the mask ALM and on the side surface SF of the mask OLM1 along each of the side surfaces. The region R3 extends from the surface of the organic film OL1 formed in the step ST3 to the lower side of the region R1. The region R1 extends on the upper surface of the mask ALM and on the region R3. The region R2 extends on the surface of the organic film OL1 formed in the step ST3 between the adjacent regions R3. As described above, since the protective film SX is formed similarly to the ALD method by repeating the sequence SQ, the respective film thicknesses of the region R1, the region R2, and the region R3 become substantially the same film thickness regardless of the density of the pattern of the mask MK1.

In the step ST7 subsequent to YES in the step ST6, the protective film SX is etched (etched back) so as to remove the region R1 and the region R2. In the step ST7, after repeatedly executing the sequence SQ, a plasma of a fourth gas is generated in the processing container 12, and by repeatedly executing the sequence SQ, particularly the film formed on the surface of the second region VL2 (the region R2 of the protective film SX) is removed (etched back) using the plasma. In the step ST7, the region R2 of the protective film SX is removed and the region R1 is also removed. Anisotropic etching conditions are necessary to remove the region R1 and the region R2. Therefore, in the step ST7, a processing gas containing the fourth gas containing fluorine is supplied into the processing container 12 from a gas source selected from among the plurality of gas sources of the gas source group 40. The fourth gas is a gas containing fluorine, for example, a fluorocarbon gas. In addition, radio frequency power is supplied from the first radio frequency power source 62. Radio frequency bias power may be supplied from the second radio frequency power source 64. By operating the exhaust device 50, the pressure of the space in the processing container 12 is set to a predetermined pressure. Accordingly, a plasma of the fluorocarbon gas is generated. Active species containing fluorine in the generated plasma cause the region R1 and the region R2 to be preferentially etched by being attracted in the vertical direction by the radio frequency bias power. As a result, as illustrated in part (d) in FIG. 3, a mask MK2 is formed by the region R3, which is left by removing the region R1 and the region R2 selectively, and the mask OLM1. The mask MK 2 may further include the mask ALM together with the region R3 and the mask OLM1. The mask MK 2 is used as a mask for etching the second region VL2 of the organic film OL.

In the step ST8 subsequent to the step ST7, the second region VL2 is etched to teach the etching target layer EL using the mask MK2 while maintaining the shape of the mask OLM1, whereby a mask OLM2 is formed from the second region VL2. During the etching of the second region VL2 in the step ST8, a plasma of a fifth gas is generated in the processing container 12, and the second region VL2 is etched using the plasma and the mask MK2 (including the mask OLM1 and the region R3). The step ST8 includes a step ST8a and a step ST8b. In the step ST8, the step ST8a is first executed subsequent to the step ST7, and the step ST8b is executed subsequent to the step ST8a. Specifically, in any of the step ST8a and the step ST8b, the fifth gas containing oxygen gas as the processing gas is supplied into the processing container 12 from a gas source selected from among the plurality of gas sources of the gas source group 40. Radio frequency power is supplied from the first radio frequency power source 62. Radio frequency bias power is supplied from the second radio frequency power source 64. Accordingly, the plasma of the fifth gas is generated. By operating the exhaust device 50, the pressure of the space in the processing container 12 is set to a predetermined pressure corresponding to each of the step ST8a and the step ST8b.

The difference between process conditions of the step ST8a and process conditions of the step ST8b is only the pressure of the space in the processing container 12 and a processing time. The execution term of the step ST8a is a term in which the pressure in the processing container 12 has reached a first pressure, the execution term of the step ST8b is a term in which the pressure in the processing container 12 has reached a second pressure after the execution term of the step ST8a. The second pressure of the space in the processing container 12 set in the step ST8b is higher than the first pressure of the space in the processing container 12 set in the step ST8a. By the step ST8b in which the pressure of the space in the processing container 12 is relatively high, as illustrated in part (e) in FIG. 3, a width PM2 of the mask OLM2 can be controlled in a state in which a width PM1 of the mask OLM1 is maintained. The processing time of the step ST8b can be controlled according to the width of the mask OLM2 formed in the step ST8, and for example, can be made equal to the processing time of the step ST8a or longer than the processing time of the step ST8a. As the processing time of the step ST8b increases, the width of the mask OLM2 decreases.

As shown in part (e) in FIG. 3, in the step ST8, the organic film OL1 is etched to reach the surface FC of the etching target layer EL, and the mask OLM2 is formed from the organic film OL1. The mask OLM2 is provided on the surface FC of the etching target layer EL, and the mask OLM1 is provided on the mask OLM2. The mask OLM2 is provided between the mask OLM1 and the etching target layer EL. The mask ALM, the mask OLM1, and the mask OLM2 are used as masks for etching the etching target layer EL.

Hereinafter, examples of main process conditions of each of the steps ST2 to ST4, the step ST5a, the step ST5c, the step ST7, the step ST8a, the step ST8b, and the sequence SQ are shown.

<Step ST2>
Pressure [mTorr] in the processing container 12: 50 [mTorr]
Value [W] of radio frequency power of the first radio frequency power source 62: 500 [W]
Value [W] of radio frequency power of the second radio frequency power source 64: 300 [W]
Value [V] of DC voltage of the power source 70: 0 [V]
Processing gas: $CF_4$ gas
Flow rate [sccm] of the processing gas: 600 [sccm]
Processing time [s]: 28 [s]

<Step ST3>
Pressure [mTorr] in the processing container 12: 20 [mTorr]
Value [W] of radio frequency power of the first radio frequency power source 62: 500 [W]
Value [W] of radio frequency power of the second radio frequency power source 64: 400 [W]
Value [V] of DC voltage of the power source 70: 0 [V]
Processing gas (first gas): $N_2/H_2$ gas
Flow rate [sccm] of the processing gas: ($N_2$ gas) 200 [sccm], ($H_2$ gas) 200 [sccm]
Processing time [s]: 40 [s]

<Step ST4>
Pressure [mTorr] in the processing container 12: 50 [mTorr]
Value [W] of radio frequency power of the first radio frequency power source 62: 300 [W]
Value [W] of radio frequency power of the second radio frequency power source 64: 0 [W]
Value [V] of DC voltage of the power source 70: −900 [V]
Processing gas: $H_2$/Ar gas
Flow rate [sccm] of the processing gas: ($H_2$ gas) 100 [sccm], (Ar gas) 800 [sccm]
Processing time [s]: 60 [s]

<Step ST5a>
Pressure [mTorr] in the processing container 12: 100 [mTorr]
Value [W] of radio frequency power of the first radio frequency power source 62: 0 [W]

Value [W] of radio frequency power of the second radio frequency power source 64: 0 [W]
Value [V] of DC voltage of the power source 70: 0 [V]
Processing gas (second gas): monoaminosilane ($H_3$—Si—R (R is an amino group))
Flow rate [sccm] of the processing gas: 50 [sccm]
Processing time [s]: 15 [s]
<Step ST5*c*>
Pressure [mTorr] in the processing container 12: 200 [mTorr]
Value [W] of radio frequency power of the first radio frequency power source 62: 300 [W], 10 [kHz], Duty 50
Value [W] of radio frequency power of the second radio frequency power source 64: 0 [W]
Value [V] of DC voltage of the power source 70: 0 [V]
Processing gas: $CO_2$ gas
Flow rate [sccm] of the processing gas: 300 [sccm]
Processing time [s]: 5 [s]
In the step ST5*c*, the following process is executed before execution of the process under the above process conditions.
Pressure [mTorr] in the processing container 12: 0 [mTorr]
Value [W] of radio frequency power of the first radio frequency power source 62: 0 [W]
Value [W] of radio frequency power of the second radio frequency power source 64: 0 [W]
Value [V] of DC voltage of the power source 70: 0 [V]
Processing gas (third gas): $CO_2$ gas
Flow rate [sccm] of the processing gas: 300 [sccm]
Processing time [s]: 10 [s]
<Step ST7>
Pressure [mTorr] in the processing container 12: 20 [mTorr]
Value [W] of radio frequency power of the first radio frequency power source 62: 100 [W]
Value [W] of radio frequency power of the second radio frequency power source 64: 100 [W]
Value [V] of DC voltage of the power source 70: 0 [V]
Processing gas: $CF_4$/Ar gas
Flow rate [sccm] of the processing gas: ($CF_4$ gas) 50 [sccm], (Ar gas) 300 [sccm]
Processing time [s]: 25 [s]
<Step ST8*a*>
Pressure [mTorr] in the processing container 12 (first pressure): 20 [mTorr]
Value [W] of radio frequency power of the first radio frequency power source 62: 300 [W]
Value [W] of radio frequency power of the second radio frequency power source 64: 0 [W]
Value [V] of DC voltage of the power source 70: 0 [V]
Processing gas (fifth gas): $O_2$ gas
Flow rate [sccm] of the processing gas: 1000 [sccm]
Processing time [s]: 40 [s]
<Step ST8*b*>
Pressure [mTorr] in the processing container 12 (second pressure): 60 [mTorr]
Value [W] of radio frequency power of the first radio frequency power source 62: 300 [W]
Value [W] of radio frequency power of the second radio frequency power source 64: 0 [W]
Value [V] of DC voltage of the power source 70: 0 [V]
Processing gas (fifth gas): $O_2$ gas
Flow rate [sccm] of the processing gas: 1000 [sccm]
Processing time [s]: 30 [s]
<Sequence SQ>
number of repetitions: 10 times As described above, in the method MT, the step of etching the organic film OL is divided into the two steps ST3 and ST8. In the first step ST3 of etching the organic film OL, the first region VL1 in the organic film OL is etched by the plasma of the first gas, the protective film SX is formed on the side surface SF of the mask OLM1 in advance (the step ST7 from the sequence SQ), and thereafter, in the second step ST8 of etching the organic film OL, the second region VL2 remaining in the organic film OL is etched to reach the etching target layer EL using the mask OLM1 and the protective film SX while maintaining the shape of the mask OLM1. As described above, in the etching of the organic film OL, in the step ST8, a reduction in a width PM1 of the mask OLM1 due to the etching can be suppressed by the protective film SX, so that a width PM2 of the mask OLM2 can be controlled independently from the width PM1 of the mask OLM1 in the step ST8. That is, the Top CD (corresponding to the width PM1 of the mask OLM1) and the Bottom CD (corresponding to the width PM2 of the mask OLM2) of the organic film OL can be independently controlled.

In addition, the etching of the organic film OL can be performed with good verticality by the plasma of the first gas containing hydrogen gas and nitrogen gas, so that variation of the pattern width due to the etching can be suppressed.

In addition, since the protective film SX is an oxide film, in a case where etching with high selectivity with respect to the oxide film is performed on the second region VL2, the etching amount of the second region VL2 (the etching amount in a direction along the surface FC of the etching target layer EL) can be favorably controlled.

In the series of steps from the sequence SQ to the step ST7, since the protective film SX is conformally formed on the side surface SF of the mask OLM1 by a method similar to the ALD (Atomic Layer Deposition) method, the protection of the mask OLM1 is improved, and the protective film SX protecting the mask OLM1 can be formed into a uniform film thickness.

In addition, since the second gas contains the aminosilane-based gas, the reaction precursor of silicon is formed on the mask OLM1 and the like along the atomic layer of the side surface SF of the mask OLM1 and the like by the step ST5*a*.

In addition, formation of the reaction precursor of silicon can be performed in the step ST5*a* using the second gas containing monoaminosilane.

In addition, as the aminosilane-based gas contained in the second gas, an aminosilane having 1 to 3 silicon atoms can be used. Alternatively, as the aminosilane-based gas contained in the second gas, an aminosilane having 1 to 3 amino groups can be used.

In addition, since the third gas contains oxygen atoms, in the step 6*c*, the oxygen atoms are bonded to the reaction precursor of silicon provided on the mask OLM1 and the like, so that the protective film of silicon oxide (the protective film SX) can be conformally formed on the mask OLM1 and the like. In a case where the third gas is carbon dioxide gas, since the third gas contains carbon atoms, erosion of the mask OLM1 and the like by the oxygen atoms can be suppressed by the carbon atoms.

In addition, etching of the film formed by repeatedly executing the sequence SQ is anisotropically performed using the plasma of the fourth gas containing fluorine, and thus the film formed on the surface of the second region VL2 (the region R2 of the protective film SX) can be selectively removed, so that etching of the second region VL2 can be performed after the removal.

In the step ST7, etching of the second region VL2 can be performed using the plasma of the fifth gas.

In addition, in the step ST8, by increasing the pressure in the processing container 12, the etching of the second region VL2 can proceed in a direction along the surface FC of the etching target layer EL. Therefore, the width PM2 of the mask OLM2 can be suitably controlled in the step ST8.

In addition, since the fifth gas contains oxygen gas, etching of the organic film OL, particularly etching of the organic film OL (particularly the second region VL2) in the direction along the surface FC of the etching target layer EL can be favorably performed.

In addition, in the step ST4, the first region VL1 is etched to reach the second region VL2, and the mask OLM1 (the first region VL1) is irradiated with secondary electrons after the mask OLM1 is formed, so that the mask OLM1 can be modified before forming the protective film SX. Therefore, damage to the mask OLM1 due to the subsequent step can be suppressed.

In addition, when the thickness of the second region VL2 is 10 [nm] or more and 20 [nm] or less before the execution of the step ST8, the width PM2 of the mask OLM2 can be favorably controlled in the step ST8.

While the principle of the present invention has been illustrated and described in the preferred embodiment, it should be noted by those skilled in the art that arrangement and details in the present invention may be changed without departing from the principle. The present invention is not limited to the specific configurations disclosed in the embodiment. Therefore, all modifications and changes from the claims and the scope of the spirit are claimed.

REFERENCE SIGNS LIST

10 . . . plasma processing apparatus; 12 . . . processing container; 12e . . . exhaust port; 12g . . . import and export port; 14 . . . support portion; 18a . . . first plate; 18b . . . second plate; 22 . . . DC power source; 23 . . . switch; 24 . . . refrigerant flow passage; 26a . . . pipe; 26b . . . pipe; 28 . . . gas supply line; 30 . . . upper electrode; 32 . . . insulating shield member; 34 . . . electrode plate; 34a . . . gas discharge hole; 36 . . . electrode support body; 36a . . . gas diffusion chamber; 36b . . . gas flow hole; 36c . . . gas introduction port; 38 . . . gas supply pipe; 40 . . . gas source group; 42 . . . valve group; 45 . . . flow rate controller group; 46 . . . deposit shield; 48 . . . exhaust plate; 50 . . . exhaust device; 52 . . . exhaust pipe; 54 . . . gate valve; 62 . . . first radio frequency power source; 64 . . . second radio frequency power source; 66 . . . matching device; 68 . . . matching device; 70: power source; AL . . . antireflection film; ALM . . . mask; Cnt . . . controller; EL . . . etching target layer; ESC . . . electrostatic chuck; FC . . . surface; FR . . . focus ring; G1 . . . second gas; HP . . . heater power source; HT . . . heater; LE . . . lower electrode; LM . . . thickness; Ly1 . . . layer; Ly2 . . . layer; MK1 . . . mask; MK2 . . . mask; MT . . . method; OL . . . organic film; OL1 . . . organic film; OLM1 . . . mask; OLM2 . . . mask; P1 . . . plasma; PD . . . placing table; PM1 . . . width; PM2 . . . width; R1 . . . region; R2 . . . region; R3 . . . region; SB . . . substrate; SF . . . side surface; Sp . . . processing space; SQ . . . sequence; SX . . . protective film; VL1 . . . first region; VL2 . . . second region; W . . . wafer.

The invention claimed is:

1. A method for processing a workpiece, the method comprising:
providing a workpiece including an etching target layer, an organic film provided on the etching target layer, and a mask provided on the organic film, the organic film being constituted by a first region and a second region, the mask being provided on the first region, the first region being provided on the second region, the second region being provided on the etching target layer;
generating a plasma of a first gas in a processing container of a plasma processing apparatus in which the workpiece is accommodated, etching the first region to reach the second region using the plasma and the mask, and conformally forming a protective film on a side surface of the first region; and
etching the second region to reach the etching target layer while maintaining a shape of the first region using the protective film, such that a second mask is formed by a portion of the second region, and a width of the mask and a width of the second mask are controlled independently of one another.

2. The method according to claim 1, wherein the first gas contains hydrogen gas and nitrogen gas.

3. The method according to claim 1, wherein the protective film is an oxide film.

4. The method according to claim 1, wherein the conformally forming of the protective film includes irradiating the first region with secondary electrons by generating a plasma in the processing container and applying a negative DC voltage to an upper electrode provided in the processing container, after the first region is etched to reach the second region and before the protective film is conformally formed on the side surface of the first region.

5. The method according to claim 1, wherein a thickness of the second region is 10 nm or more and 20 nm or less before the etching of the second region.

6. The method according to claim 1, wherein the width of the second mask is smaller than the width of the mask.

7. The method according to claim 1, wherein the etching of the second region generates a plasma of a fifth gas in the processing container, and etches the second region using the plasma, the first region, and the protective film.

8. The method according to claim 7, wherein the etching of the second region includes a term in which a pressure in the processing container reaches a first pressure, and a term in which the pressure in the processing container reaches a second pressure after that term, and
the second pressure is higher than the first pressure.

9. The method according to claim 7, wherein the fifth gas contains oxygen gas.

10. The method according to claim 1, wherein the conformally forming of the protective film repeats, after the first region is etched to reach the second region, a sequence including
supplying a second gas into the processing container;
purging a space in the processing container;
generating a plasma of a third gas in the processing container; and
purging the space in the processing container, and
a plasma of the second gas is not generated in the supplying of the second gas.

11. The method according to claim 10, wherein the conformally forming of the protective film further includes;

generating a plasma of a fourth gas in the processing container after repeating the sequence; and removing a film formed on a surface of the second region by repeating the sequence, using the plasma, and the fourth gas contains fluorine.

12. The method according to claim 10,
wherein the third gas contains an oxygen atom.

13. The method according to claim 12,
wherein the third gas contains carbon dioxide gas or oxygen gas.

14. The method according to claim 10,
wherein the second gas contains an aminosilane-based gas.

15. The method according to claim 14,
wherein the second gas contains a monoaminosilane.

16. The method according to claim 14,
wherein the aminosilane-based gas contained in the second gas contains an aminosilane having 1 to 3 silicon atoms.

17. The method according to claim 14,
wherein the aminosilane-based gas contained in the second gas contains an aminosilane having 1 to 3 amino groups.

* * * * *